(12) United States Patent
Ly et al.

(10) Patent No.: US 7,953,954 B2
(45) Date of Patent: May 31, 2011

(54) FLASH STORAGE PARTIAL PAGE CACHING

(75) Inventors: Viet Ly, San Jose, CA (US); Michael Murray, Mountain View, CA (US)

(73) Assignee: Micron Technology, Inc., Boise, ID (US)

( * ) Notice: Subject to any disclaimer, the term of this patent is extended or adjusted under 35 U.S.C. 154(b) by 593 days.

(21) Appl. No.: 11/698,456

(22) Filed: Jan. 26, 2007

(65) Prior Publication Data

US 2008/0183949 A1    Jul. 31, 2008

(51) Int. Cl.
*G06F 12/08* (2006.01)
(52) U.S. Cl. ......... 711/209; 711/103; 711/206; 711/221
(58) Field of Classification Search .................. None
See application file for complete search history.

(56) References Cited

U.S. PATENT DOCUMENTS

| | | | |
|---|---|---|---|
| 7,558,906 B2 * | 7/2009 | Sinclair et al. ............... | 711/103 |
| 2007/0214309 A1 | 9/2007 | Matsuura et al. | |

FOREIGN PATENT DOCUMENTS

| | | |
|---|---|---|
| WO | WO-03021448 A1 | 3/2003 |
| WO | WO-2006065668 A2 | 6/2006 |
| WO | WO-2008094475 A2 | 8/2008 |

\* cited by examiner

*Primary Examiner* — Gary J Portka
(74) *Attorney, Agent, or Firm* — Schwegman, Lundberg & Woessner, P.A.

(57) ABSTRACT

Methods and apparatus may operate to receive allocation requests from a processor configured to manage memory comprising a non-volatile memory device configurable as a plurality of blocks comprising a plurality of sectors, assign partial page blocks from the plurality of blocks for memory storage, fill some of the sectors by storing data bits associated with the allocation request in the at least one of the plurality of sectors, determine that the sectors are full, assigning a full page block from the plurality of blocks, and transfer the data bits associated with the allocation request from the partial page blocks to the full page block. Other apparatus, systems, and methods are disclosed.

39 Claims, 6 Drawing Sheets

FLASH STORAGE PARTIAL PAGE CACHING

TECHNICAL FIELD

Embodiments of this disclosure may relate generally to memory devices including non-volatile memory devices.

BACKGROUND

Memory devices include semiconductor, integrated circuits in computer or other electronic devices. There are many different types that include random-access memory (RAM), read-only memory (ROM), dynamic random access memory (DRAM), synchronous dynamic random access memory (SDRAM), and flash memory.

Flash memory devices may utilize one-transistor memory cells which allow for high memory density, high reliability and low power consumption. Flash memory devices are made in two forms: NOR flash and NAND flash. NAND flash can be either single-level cell (SLC) or multi-level cell (MLC). These memory devices can be categorized further into two broad areas as volatile and non-volatile. Volatile memory devices require power to maintain data, while non volatile memories are capable of maintaining data in the absence of a power supply. An example of a non-volatile memory is a flash memory that stores information on a semiconductor without the need for power to maintain the information in the chip. MLC non-volatile memory allows for higher density memory because it allows storage of two or more data bits in each memory cell. Memory devices can be organized or configured into blocks that are divided up into pages, having smaller segments, named sectors. Each sector is able to store bits of information, the number of bits is determined by the density of the memory device. Considering that the process of filling sectors with data by storing data bits affects the performance of the memory devices, it may be desirable to reduce the length of the flash data block program and erase cycle. Thus, reducing data transfer times may increase reliability, and reduce performance losses.

DETAILED DESCRIPTION

Some of the disclosed embodiments provide a method for partial page caching of flash memory in preparation for filling memory blocks. In an embodiment, a memory allocation request is received from a processor adapted to manage SLC and MLC non-volatile memory devices configures as a plurality of blocks, each block including multiple sectors to store a plurality of data bits, wherein a partial page block may be assigned and filled with data (by storing bits) until the partial page block is full. Partial page caching provides a method of filling a full page with data, provided there is contiguous data to be added to the data block, avoiding the need for a new block each time partial page data is required. Implementing this novel method may shorten the flash data block program and erase cycle time, and improve performance.

There are two types of data blocks, full page and partial page. A full page block contains a full page of contiguous sectors of data designed to be written to as a full page. If there is less data than will fill the full page block during a single allocation request, the full page block remains partially filled until the data is removed, leaving unused space. The full page block also contains block information in a spare location of each written page for block identification, and the block information is the same for each written page within that block. A partial page block contains at least one partial page of data that is assigned to one of the full page blocks.

A partial page block contains unique logical sector address information which may be in the last sector of each partially written page. The logical sector address range may be restricted to the logical sector range of one of the partially filled full page blocks.

An example in which data is cached or merged includes the processing involved with a write request. First, the starting request sector of a full page block may be checked for an offset within the starting page (e.g., the first empty sector is not the first sector in the page). An offset can be an indication that data is already written in the first part of the page. If an offset exists, the write request prompts searching from the beginning of the page boundary for preceding sectors (e.g., sectors associated with the current write request intended to reach the same destination in memory). If no preceding sectors are present, the write request may be a non-sequential write request, or the first of a new sequence. Next, the write request prompts the use of a lookup table used to store valid entry address information and, if a valid entry exists, the current partial page data is written into this previously-written full page block. If the remaining sectors of this previously written full page block do not have sufficient space to hold the data associated with the write request, the remaining sectors are written to a new page in the partial page block.

Figure 1:
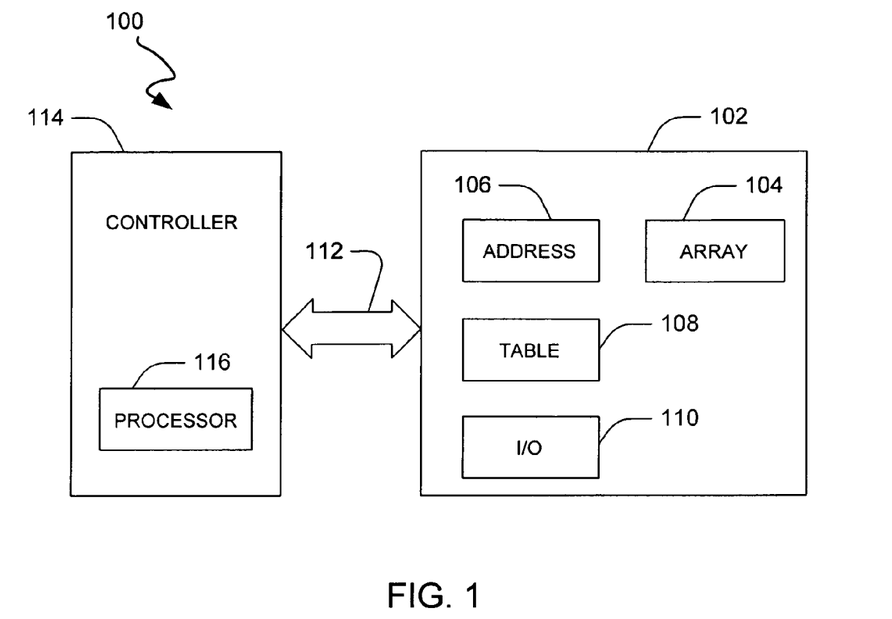
FIG. 1 is a block diagram of a memory system, according to various embodiments of the invention.

FIG. 1 is a simplified block diagram of a memory system 100, according to various embodiments of the present invention. In various embodiments, memory system 100 includes an integrated circuit 102 having an array of non-volatile floating gate memory cells 104 configured to include a look up table 108, address circuitry 106, and input/output (I/O) circuitry 110. Memory cells 104 may also be referred to as flash memory because blocks of memory cells 104 may be erased concurrently, in a flash operation.

The memory system 100 may include a memory controller 114, which in turn may include a processor 116. The processor 116 may utilize control lines 112 to communicate with the memory array 104 via integrated circuit 102. Access to the memory array 104 may include one or more targeted or specified memory cells linked by addressing via the control lines 112. When access to one or more memory cells contained within the memory array 104 is established by the processor 116, data may be written to or read from the memory cells 104. When an allocation request associated with a read request is sent by the processor 116, such an operation may include accessing multiple rows or pages of data to allow identification of related data contained within the memory array 104. The memory controller 104 and/or processor 116 may be used to maintain the lookup table 108.

Figure 2:
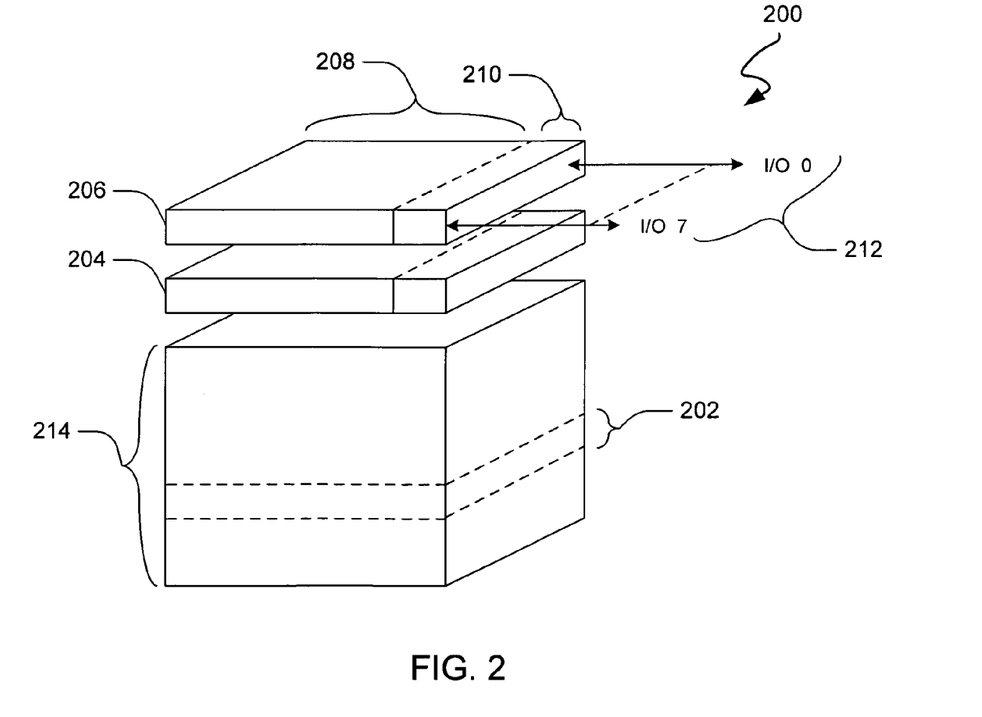
FIG. 2 is a block diagram showing the organization of arrays of memory cells in a NAND flash memory, according to various embodiments of the invention.

FIG. 2 is a schematic diagram showing the organization architecture of arrays of memory cells in a NAND flash memory 200, according to various embodiments of the present invention. Memory 200 may include a block 202, which may be representative of a portion of memory in an array similar to memory array 104. The memory 200 may further include a data register 204, a cache register 206, a data area 208, a spare area 210, I/O ports 212 and a plane 214. The data are transferred to and from the NAND flash memory 200, byte by byte through the data register 204 and the cache register 206. The cache register 206 may be closest to I/O control circuitry, such as I/O circuitry 110 shown in FIG. 1, and may act as a data buffer for the I/O data, whereas the data register 204 may be closest to the memory array, such as memory array 104, and may act as a data buffer for the NAND flash memory array operation. In various embodiments, the length of data area 208 and spare area 210 is defined as a "page." In certain examples, NAND flash memory is programmed and read in page-based operations, and is erased in block-based operations. In certain examples, during page read and write operations, the data register 204 and cache register 206 are coupled together and act as a single register. In certain examples, during cache operations, the data register 204 and cache register 206 operate independently to increase data throughput.

NAND flash memory shown in FIG. 2 may be configured as blocks 202 of pages. Each block 202 usually comprises 16, 32, or 64 pages. In various embodiments, each page may comprise 512 bytes (256 words) in data area 208 and an extra 16 bytes (8 words) in spare area 210. In various embodiments, each page may have 2048 bytes (1024 words) in data area 208 and 64 bytes (32 words) in spare area 210. Spare area 210 may be used to store bits used for marking invalid blocks during the production process. Additionally, spare area 210 may store logical address information used to reference partial page cache entries associated with multiple full page blocks. The example of FIG. 2 shows the I/O ports 212 as having a range of bits zero to seven (or 8 bits total) but this may vary as described with respect to page sizes above.

In various embodiments of MLC NAND flash memory, a whole page can be programmed at the same time. An allocation request associated with a read or write operation to transfer information may occur on a page basis (e.g., 528 bytes at a time, as opposed to a byte or word basis that is performed in a NOR flash.) Additionally, the erase operation may occur on a block basis. In the operation of some embodiments, during a page read operation in various embodiments, a page of 528 bytes is transferred from memory into the data register 204. In a page write operation, a page of 528 bytes is written into the data register 204 and then programmed into the memory array 104, such as within the space comprising data area 208. Also, in a block erase operation, a group of consecutive pages may be erased in a single operation.

There are two types of data blocks described herein. The full page block, having full pages of contiguous sectors of data, and the partial page block, containing partial pages of data associated with a partially filled page block. In some embodiments of the present invention, the full page block is limited to storing data bits only one time for each associated allocation request. In this manner, there is a high probability that the full page block will go unfilled most of the time, which may leave a significant amount of unused sectors of data. In some embodiments, data contained within the partial page block will have the ability to be filled more than one time on subsequent allocation requests and combined with new contiguous sectors of data to form a full page. This arrangement is designed to ensure that a data block is filled with a full page of data as long as there is contiguous data that can be added to the data block. Efficiency can be gained due to avoiding having to use a new block each time an allocation request occurs with insufficient data to fill a full page.

Figure 3:
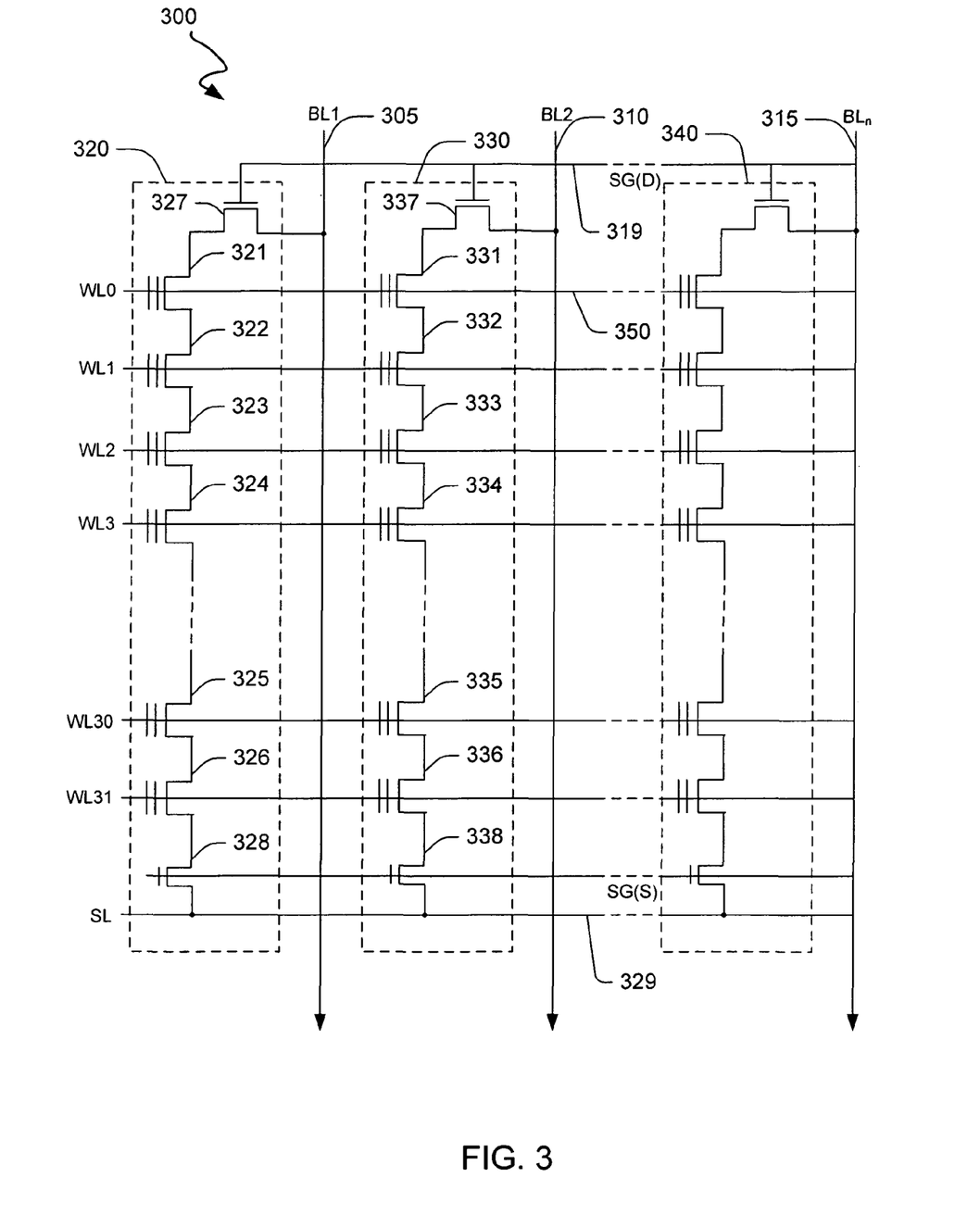
FIG. 3 is a schematic diagram of a NAND flash memory array, according to various embodiments of the present invention.

FIG. 3 is a schematic diagram of a NAND flash memory array 300, according to various embodiments of the present invention. The memory array 300, which may be similar to or identical to memory array 104 in FIG. 1, is shown with a number of bit lines (e.g., bit lines BL1, BL2-BL$_n$), and the quantity used may depend upon the memory density of the array. The memory array 300 includes an array of floating gate memory cells 321-326 arranged in series string 320. Each of the floating gate memory cells 321-326 is connected drain to source, in a series string, such that the drain of the first floating gate memory cell 321 attaches to first bit line BL1 through first drain select gate 327. The state of the first drain select gate 327 is controlled by drain select gate control line SG(D) 319. The arrangement of the series string 320 includes the last floating gate memory cell 326 attached to the first bit line BL1 through first source select gate 328 and controlled by source select gate control line SG(S) 329. A similar arrangement occurs in the second series string 330 and final series string 340 such that the final series string 340 may determine the memory density of the array. As such, similar elements are labeled in a similar manner. The second series string 330 includes an array of floating gate memory cells 331-336, connected drain to source, having the first drain memory cell 331 attached to second bit line BL2 through second drain select gate 337, and is controlled by drain select gate control line SG(D) 319. The last memory cell 336 of the second series string 330 attaches to the second bit line BL2 through second source select gate 338, and is controlled by source select gate control line SG(S) 329.

Word-lines (e.g., word-lines WL0-WL31) that span multiple series strings 320, 330 and 340 may be coupled to the control gates of every floating gate memory cell in a given row to control their operation. For example, as shown in FIG. 3, the first word line WL0 350 couples to each first floating gate memory cell 321, 331 and 341 of bit lines BL1, BL2 and BL$_n$. Each bit line BL1-BL$_n$ eventually couples to sense amplifiers (not shown) that detect the state of each cell. In operation, WL0-WL31 may select the individual floating gate memory cells in the series strings 320, 330 and 340 to be written to or read from and operate the remaining floating gate memory cells in each series string 320, 330 and 340 in a pass-through mode.

Each floating gate memory cell can be programmed using a single bit per cell or multiple bits per cell. SLCs allow programming a single bit per cell and MLCs permit programming multiple bits per cell. Each floating gate memory cell's threshold voltage ($V_t$) determines the data that is stored in the cell. For example, in a single bit per cell architecture, a $V_t$ of 1V might indicate a programmed cell while a $V_t$ of −1V might indicate an erased cell.

The MLC architecture has more than two $V_t$ windows per cell that each indicate a different storage state. Multilevel floating gate memory cells take advantage of the analog nature of a traditional flash cell by assigning a bit pattern to a specific voltage range stored on the cell. This technology permits the storage of two or more bits per cell, depending on the number of voltage ranges assigned to the cell. In certain examples, a floating gate memory cell may be assigned four different voltage $V_t$ distributions having a width of approximately 200 milivolts (mV). In various embodiments, a separation of 0.3V to 0.5V is assigned between each $V_t$ distribution range as well. Reductions in this separation zone between the $V_t$ distributions may increase the chance that the multiple $V_t$ distributions overlap, which can lead to logic errors.

Programming selected floating gate memory cells within a selected word-line (WL) may be accomplished by sinking the bit line (BL) to 0V. This results in a potential formed across the channel, and the WL will cause the floating gate memory cell to be programmed. The $V_t$ will increase as higher voltage programming pulses are applied. Between each programming pulse, a verification phase is performed in which the selected WL is lowered to 0V, the unselected WLs are lowered to 5V and the state of the selected WL is detected. If the floating gate memory cell contains a $V_t$ sufficient to prevent conduction of the device with 0V on the WL, it is deemed to be programmed, otherwise it is deemed to be still erased and the programming pulse height is increased by 0.5V and again applied to the selected WL. This process is repeated until all selected WLs are detected as being programmed.

Figure 4:
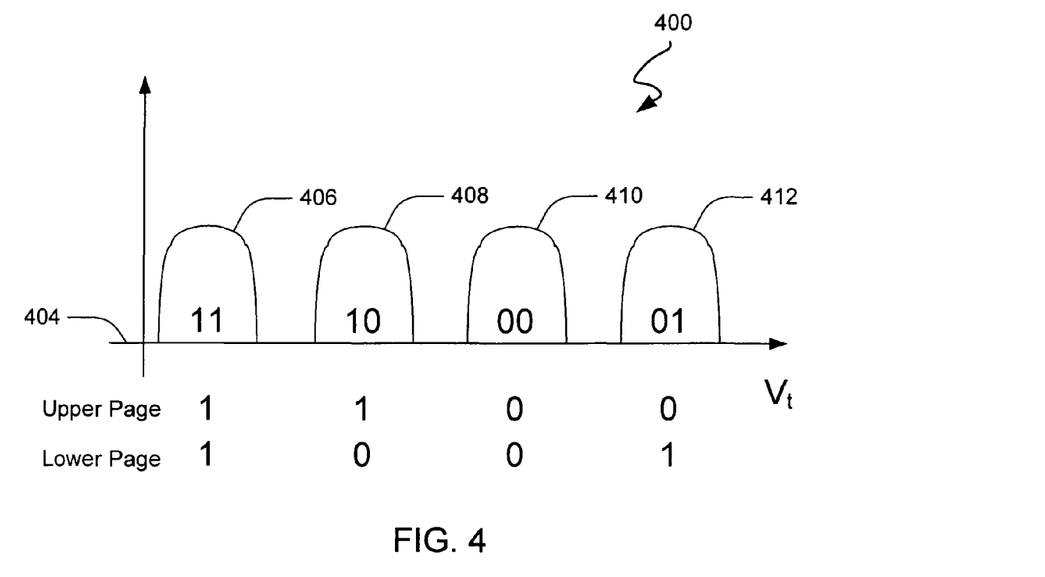
FIG. 4 is a diagram showing the distribution of threshold voltage of a MLC array of FIG. 3, according to various embodiments of the present invention.

FIG. 4 is a diagram showing the distribution of threshold voltages of a MLC array of FIG. 3, according to various embodiments of the present invention. The X-axis 404 represents threshold voltages ($V_t$) from lowest threshold 406 to highest threshold 412. In certain examples, programming begins with the highest threshold 412 performed first on the associated WL in decreasing order of threshold voltages, as the lowest threshold 406 represents an erased state. The erased state, or lowest threshold 406, indicates a logical "11" since both bits of the multi-level cell are in a "1" state when erased. It should be noted that, alternatively, some memory devices may indicate an erased state with a logical "0" on each bit. In certain examples, the highest threshold 412 is the first programmed threshold. This places the highest voltage on the WL prior to all lower multi-level distributions being programmed, which reduces the chance of disturbing conditions with respect to other cells on the same WL that are to be programmed at lower $V_t$ distributions. In some embodiments, all the cells in a page to be programmed with bits having the highest threshold 412 are programmed first. The next highest threshold 410 may be programmed next, followed by the next to lowest threshold 408, and then the lowest threshold 406. These programming operations may be accomplished with consecutive programming and verification pulses where two verification pulses with two different levels are applied (i.e., 2V for "01," and 1.3V for "00") between every increasing programming pulse. This procedure may repeat for each data bit within each sector of a page when attempting to fill a data block.

Figure 5:
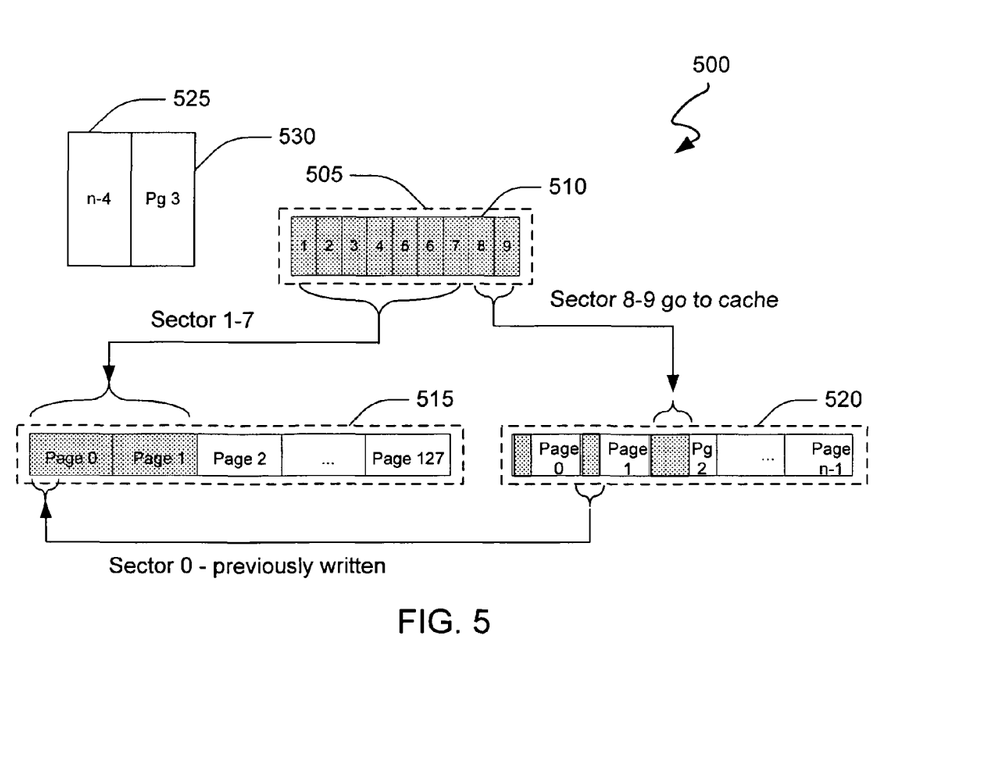
FIG. 5 is a block diagram of an example write request that performs both data merge from cache and data write to cache, according to various embodiments of the present invention.

FIG. 5 is a block diagram of an example write request that performs both data merge from cache and data write to cache, according to various embodiments of the present invention. The block diagram 500 represents a write request associated with an allocation request, according to various embodiments of the present invention, which includes an allocation request block 505, comprising sectors 510 of data.

The number of sectors that make up a full page may vary from system to system, however, in certain examples as shown in this block diagram 500, four sectors may equal a full page. A full page block 515 represents the full pages for the data to be written. The number of pages within a full page block may vary from system to system. In the block diagram 500, a total of 128 pages are present in the full page block 515 (Pages 0-127). The partial page block 520 represents the partial pages for temporary storage of sectors of data that are insufficient to fill a full page within the full page block 515.

Two tables may be utilized to store information related to the partial page block 520. The first table, called the partial page table 525, stores a variable representing the partial page count remaining in the partial page block 520 and the second table, called the partial page sector count table 530, stores the location of the next valid partial page within the partial page block 520. The partial page table 525 may have a predefined number of entries and each entry may contain a logical sector address from those available sectors within a given partial page. Either the partial page table 525, or the partial page sector count table 530, may be located in a memory array, such as the memory array 104 of FIG. 1, and accessed/maintained by a memory controller, such as the memory controller 114 of FIG. 1.

In one example, an allocation request associated with a write operation occurs. The partial page table 525 is searched for previously written sector to be joined with data of the current request to form a full page of sectors, and then transferred to a full page within the full page block 515. If the allocation is associated with combining the previously written partial page sectors with the current write request sectors, random access memory (RAM) may be utilized to merge the sectors to form a full page of sectors, which is then transferred to the next available full page within the full page block 515. An example of RAM includes dynamic random access memory (DRAM).

In block diagram 500, the partial page table 525 indicates that the current request is associated with previously written sector 0 of page 1 of the partial page block 520. The combination of the previously written sector 0 of page 1 of the partial page block 520 with the first seven sectors of the current request (sectors 1-7) will be able to fill two full pages of the full page block 515. After the data from the previously written sector 0 of page 1 of the partial page block 520 is moved to the full page block 515, sector 0 of page 1 is invalidated (e.g., released for later use). Invalidating of sector 0 of page one may occur by filling all of the bits associated with sector 0 with logic "1."

As shown, there will be two sectors remaining (sectors 8-9) of the current write request. Considering there are sufficient sectors to fill at least one page of the full page block 515, the partial page block 520 is not needed for the additional sectors (sectors 1-7) and therefore RAM can be utilized to merge the previously written sector 0 with the current sectors 1-7 to form two full pages to be written directly to page 0 and page 1 of the full page block 515. The remaining sectors, sectors 8-9 associated with the current request, are not sufficient to fill a full page alone or in combination with other partial page sectors to fill a full page, and are therefore placed within the partial page block 520. The partial page sector count table 530 is read, which identifies sector 0-1 of partial page 2 of the partial page block 520, as being the next available sector. The data of the current request sectors 8-9 are then transferred into partial page 2, sectors 0-1. If this example were a read request instead of a write request, the process may be substantially the same. A memory controller, such as the memory controller 114 shown in FIG. 1 may be configured to effect any of the activities described with respect to FIG. 5.

Figure 6:
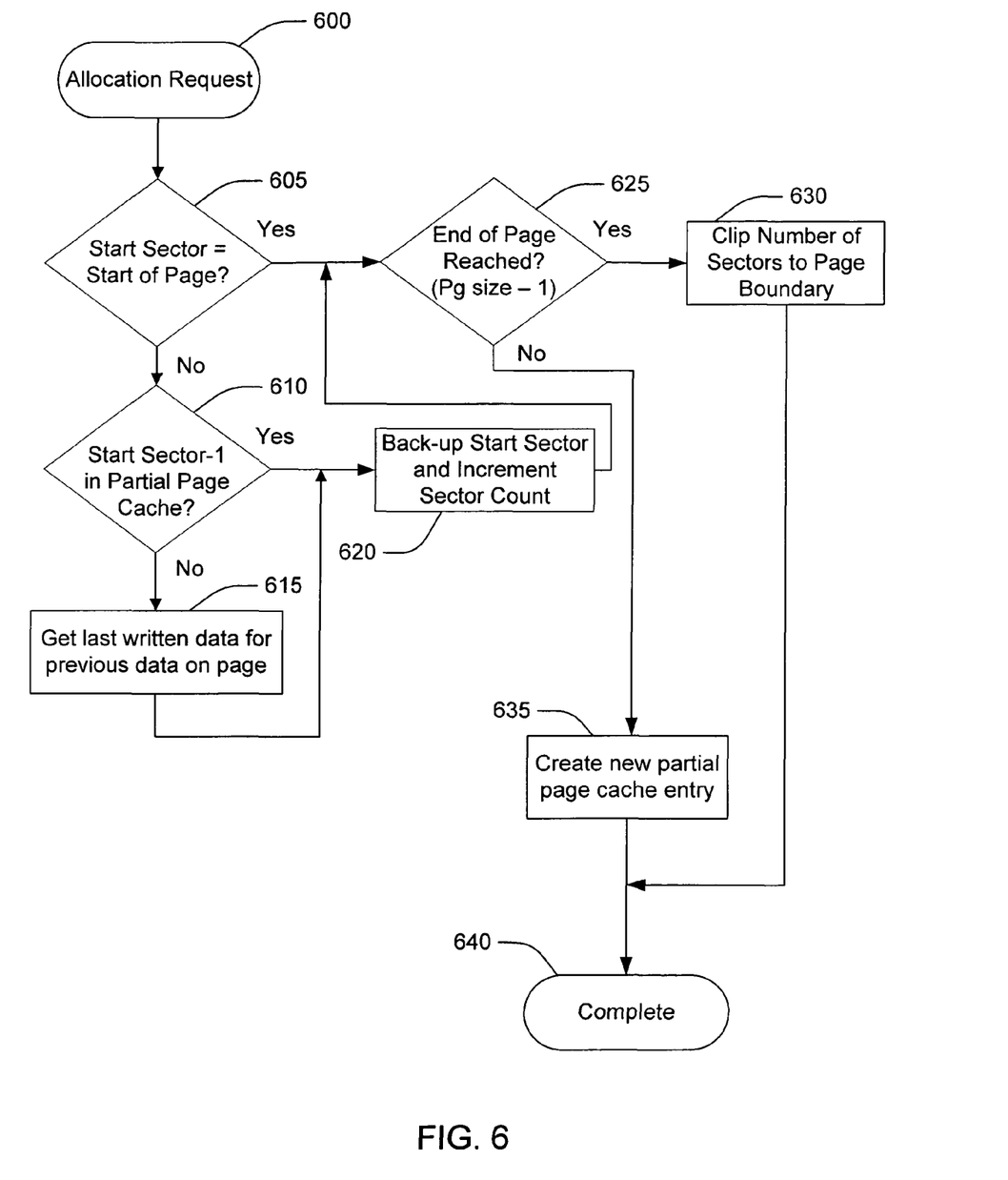
FIG. 6 is a flow chart of a method for partial page caching using multi-level cell flash devices, according to various embodiments of the invention.

FIG. 6 is a flow chart of a method for partial page caching using MLC flash devices, according to various embodiments of the invention. At 600, an allocation request comprising either a write or read request is received from a processor. At 605, the start sector of the current request is checked for a start of the page, which identifies whether it is associated with a prior request. If the start of the page is not first identified, the request is assumed to be associated with a prior request and, at 610, the partial page block is searched for the start sector (e.g., a search for prior cached data is conducted). If the start sector is not found within the partial page block, at 615, previously written data is retrieved to obtain associated data from the prior allocation request and, at 620, the start sector is adjusted to include the prior data. If, however, at 610, the prior related sector data is found within the partial page block, at 620, the start sector is backed-up and the sector count is increased to include the prior data and, at 625, the number of sectors is compared to the available page size. Similarly, if at 605, the start sector was not associated with a prior request, at 625, the number of sectors is compared to the available page size (page size-1). If at 625, it is determined that the page size has been exceeded, at 630, the excess sectors are clipped off of the page boundary and, at 640 the request is complete. A memory controller, such as the memory controller 114 shown in FIG. 1 may be configured to effect any of the activities described with respect to FIG. 6.

Figure 7:
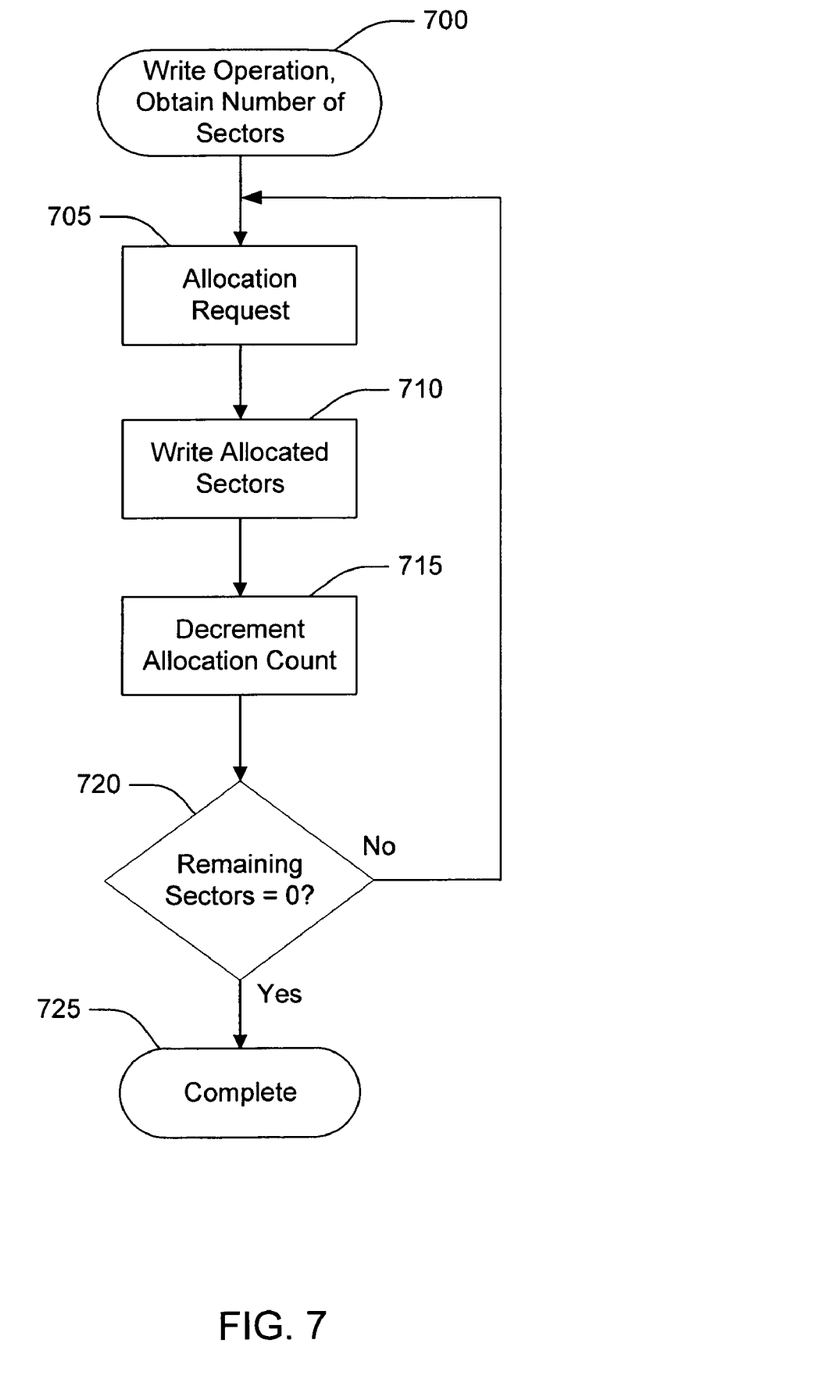
FIG. 7 is system level flow chart of a method for partial page caching using multi-level cell flash devices, according to various embodiments of the invention.

FIG. 7 is system level flow chart of a method for partial page caching using multi-level cell flash devices, according to various embodiments of the invention. At 700, a write operation may be requested as part of a control operation, such as a user request to a signal processor. As a result, at 705, the processor may send an allocation request for the write operation (an allocation request for a read operation may occur in a similar manner) so that available sectors may be allocated to this request. At 710, the allocated sectors are written and at 715, the count for remaining allocation sectors is decremented to account for the already written sectors. At 720, if there are no remaining sectors needed from the allocation request, at 725, the operation is complete. If, however, at 720, there are remaining sectors needed, then at 705, the next allocation request is sent by the processor.

Figure 8:
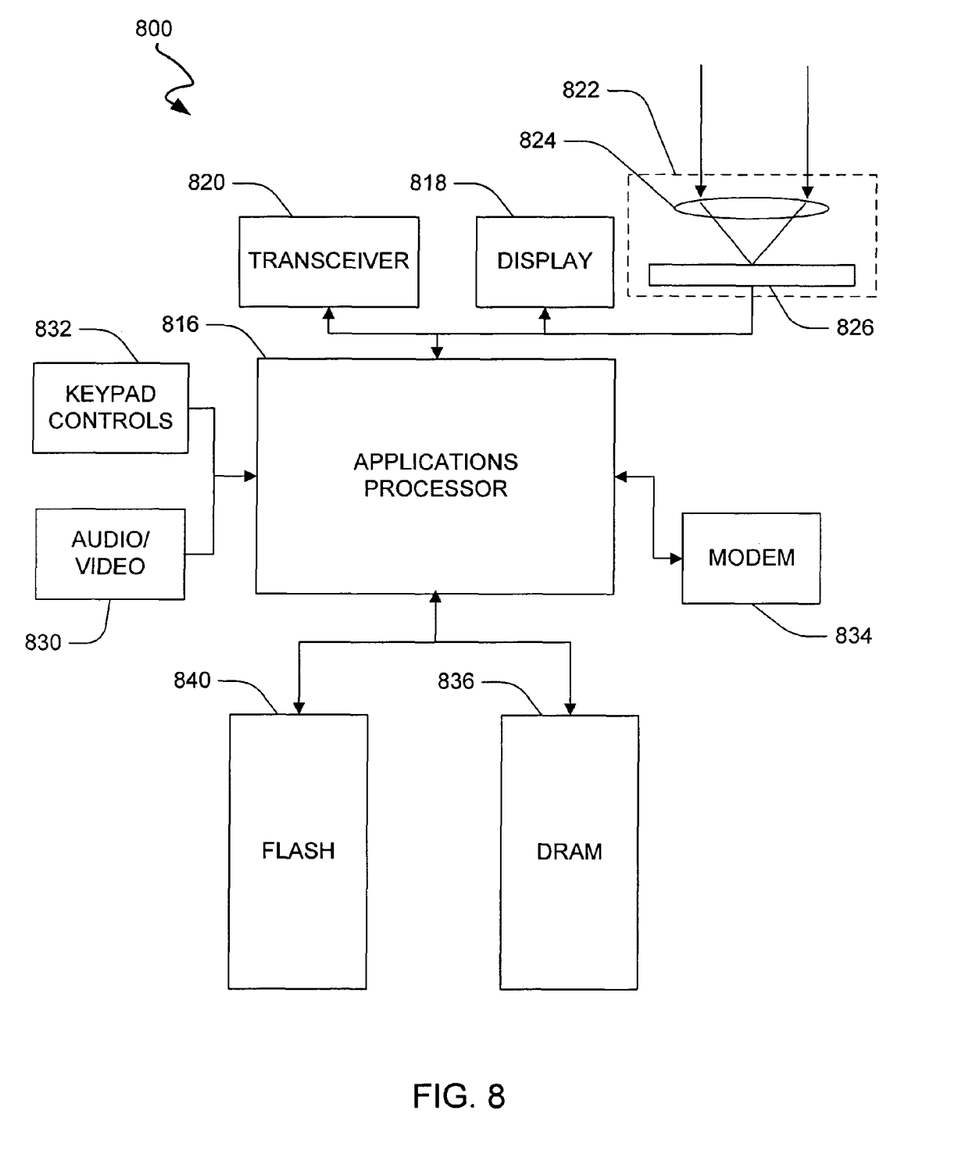
FIG. 8 is a block diagram of a system according to various embodiments of the invention.

FIG. 8 is a block diagram of a system 800 according to various embodiments of the invention. The system 800 may include one or more apparatus, which may be similar to or identical to that of memory system 100 in FIG. 1. The system 800, in some embodiments, may comprise a processor 816 coupled to a display 818 and/or a wireless transceiver 820. The memory system 100 included in the apparatus 800 and comprising a plurality of memory cells may also be operatively coupled to the processor 816.

In various embodiments, the system 800 may comprise a camera 822, including a lens 824 and an imaging plane 826 coupled to the processor 816. The imaging plane 826 may be used to receive light rays 828 captured by the lens 824. Many variations of system 800 are possible. For example, in various embodiments, the system 800 may comprise an audio/video media player 830, including a set of media playback controls 832, coupled to the processor 816. In various embodiments, the system 800 may comprise a modem 834, a DRAM device 836, and a non-volatile flash memory device 840, all coupled to the processor 816.

While partial page cache operations have been discussed in association with the various examples herein, including specific arrangements of data, the various embodiments are not so limited. The size of page blocks, pages, and sectors may vary according to the design of a particular memory device.

Although specific embodiments have been illustrated and described herein, it will be appreciated by those of ordinary skill in the art that any arrangement which is calculated to achieve the same purpose may be substituted for the specific embodiments shown. This application is intended to cover adaptations or variations of the present subject matter. It is to be understood that the above description is intended to be illustrative, and not restrictive. Combinations of the above embodiments, and other embodiments will be apparent to those of skill in the art upon reviewing the above description.

The scope of the present subject matter should be determined with reference to the appended claims, along with the full scope of equivalents to which such claims are entitled.

The examples that are described in the above description provide sufficient detail to enable those skilled in the art to practice the inventive subject matter, and serve to illustrate how the inventive subject matter may be applied to various purposes or embodiments. References to "an", "one", or "various" embodiments in this disclosure are not necessarily to the same embodiment, and such references may contemplate more than one embodiment. Other embodiments may be utilized, and structural, logical, and electrical changes may be made without departing from the scope of the present disclosure.

Such embodiments of the inventive subject matter may be referred to herein individually or collectively by the term "invention" merely for convenience and without intending to voluntarily limit the scope of this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment.

What is claimed is:

1. A method comprising:
   receiving an allocation request from a processor configured to manage memory comprising a non-volatile memory device configurable as a plurality of blocks comprising a plurality of sectors;
   assigning at least one partial page block from the plurality of blocks for memory storage;
   filling at least one of the plurality of sectors of the at least one partial page block by storing data bits associated with the allocation request in the at least one of the plurality of sectors;
   updating two tables including a partial page table to indicate a partial page count remaining, and a partial page sector count table to indicate a location of a next available page and sector of the at least one partial page block;
   receiving another allocation request;
   determining that the stored data bits in the at least one of the plurality of sectors and one or more sectors of data in the other allocation request combine to form one or more full pages;
   assigning a full page block from the plurality of blocks; and
   transferring one or more full pages to the full page block, the one or more full pages formed using a random access memory to merge the data bits associated with the allocation request from the at least one partial page block with the one or more sectors of data in the other allocation request.

2. The method of claim 1, wherein filling at least one of the plurality of sectors of at least one partial page block comprises writing at least one sector address to a page table.

3. The method of claim 1, wherein filling at least one of the plurality of sectors comprises storing the data bits associated with the allocation request to fill at least one sector of at least one block of the partial page block.

4. The method of claim 3, wherein storing the data bits associated with the allocation request to fill at least one sector comprises finding a next erased partial page.

5. A method comprising:
in a non-volatile memory device configurable as a plurality of blocks comprising a plurality of sectors, assigning at least one partial page block from the plurality of blocks for memory storage;
filling at least one of the plurality of sectors in the at least one partial page block by storing data bits associated with an allocation request in at least one of the plurality of sectors, to include referencing a partial page table maintained in the non-volatile memory device to determine a number of pages remaining in the at least one partial page block and referencing a sector count table to determine an identity of a next available page and sector of the at least one partial page block;
determining that the at least one of the plurality of sectors is full;
assigning a full page block from the plurality of blocks; and
transferring the data bits associated with the allocation request from the at least one partial page block to the full page block.

6. The method of claim 5, wherein determining that at least one of the plurality of sectors of the at least one partial page block is full comprises finding enough filled partial page blocks in the at least one partial page block to fill the full page block.

7. The method of claim 5, wherein assigning at least one partial page block comprises using a table to determine a number of filled sectors within each partial page block.

8. The method of claim 5, wherein transferring the data bits associated with the allocation request from at least one partial page block to the full page block comprises invalidating data stored in the at least one partial page block after the transferring.

9. The method of claim 5, wherein receiving the allocation request is associated with at least one read operation.

10. A method, comprising:
receiving an allocation request associated with a memory write operation at a non-volatile memory device configurable as a plurality of blocks comprising a plurality of sectors;
assigning at least one partial page block from the plurality of blocks for memory storage;
filling at least one of the plurality of sectors in the at least one partial page block by storing data bits associated with an allocation request in at least one of the plurality of sectors;
updating two tables including a partial page table to indicate a partial page count remaining, and a partial page sector count table to indicate a location of a next available page and sector of the at least one partial page block;
determining that the stored data bits in the at least one of the plurality of sectors and one or more sectors of data in another allocation request combine to form one or more full pages;
assigning a full page block from the plurality of blocks; and
transferring one or more full pages to the full page block, the one or more full pages formed using a random access memory to merge the data bits associated with the allocation request from the at least one partial page block with the one or more sectors of data in the other allocation request.

11. The method of claim 10, wherein receiving the allocation request comprises checking for existence of a starting request sector of the plurality of sectors for an offset within a starting page of the at least one partial page block.

12. The method of claim 11, wherein checking for existence of a starting request sector comprises searching one or more preceding sectors of the plurality of sectors and combining two or more sectors to fill at least one page of the full page block.

13. The method of claim 10, wherein the non-volatile memory device comprises a NAND flash memory array including at least one of a single level cell architecture and a multi-level cell architecture.

14. A method comprising:
managing access to a multi-level cell non-volatile memory device configured as a plurality of data blocks comprising at least one full page block and at least one partial page block including partial pages of data stored in a plurality of sectors assigned to the at least one full page block by assigning at least one partial page block to the at least one full page block, such that each page within the at least one full page block contains assignment information common with other pages in the at least one full page block, and each partially written page within the at least one partial page block contains unique logical sector address information;
updating two tables including a partial page table to indicate a partial page count remaining, and a partial page sector count table to indicate a location of a next available page and sector of the at least one partial page block;
filling at least one sector of the partial pages with a logical address comprising a range to include the address of the assigned full page block;
determining that the at least one partial page block is full; and
transferring data from the at least one partial page block to the at least one full page block.

15. The method of claim 14, wherein filling at least one sector of the partial pages comprises writing at least one address to a page table maintained in the multi-level cell non-volatile memory device.

16. The method of claim 15, wherein writing at least one address to a page table comprises referencing a sector count table maintained in the multi-level cell non-volatile memory device to determine a number of written sectors in the at least one partial page block.

17. The method of claim 14, wherein filling at least one sector of the partial pages comprises finding an invalidated sector before an erased sector.

18. The method of claim 14, wherein determining that the at least one partial page block is full comprises finding at least enough filled partial page blocks in the at least one partial page block to fill the at least one full page block.

19. The method of claim 14, wherein assigning at least one partial page block comprises using a table to determine a number of filled sectors within each partial page block.

20. The method of claim 14, wherein transferring data from the at least one partial page block to the at least one page block comprises removing data in the at least one partial page block after the transferring.

21. The method of claim 14, wherein assigning at least one partial page block is associated with at least one read operation.

22. The method of claim 14, wherein assigning at least one partial page block is associated with at least one write operation.

23. The method of claim 22, wherein assigning at least one partial page block comprises checking a starting request sector of the plurality of sectors of at least one partial page block for an offset within a starting page of the at least one partial page block.

24. The method of claim 23, wherein checking a starting request sector comprises searching preceding sectors and combining sectors to fill at least one page of the at least one full page block.

25. An apparatus, comprising:
a memory controller; and
a memory array to couple to the memory controller, the memory array comprising a multi-level cell non-volatile memory device configured as a plurality of data blocks comprising at least one full page block to include one or more full pages comprising a plurality of contiguous sectors, and at least one partial page block to include partial pages comprising a plurality of sectors configured to be assigned to the at least one full page block;
a partial page table maintained within the memory array to store one or more addresses of at least one page of the at least one partial page block, the partial page table to store a variable representing a partial page count remaining in the partial page block; and
a sector count table maintained within the memory array to store a number indicating the plurality of sectors for a selected page of the partial pages which are filled, the sector count table to store a location of a valid partial page that is next within the partial page block.

26. The apparatus of claim 25, wherein the partial page block comprises sectors to be assigned to more than one full page block.

27. The apparatus of claim 25, wherein the partial page table is searchable by the memory controller for previously filled sectors to be merged with newly written sectors.

28. The apparatus of claim 27, wherein the memory controller is configured to release the previously written sectors and the newly written sectors after a merge operation.

29. An apparatus, comprising:
a memory controller;
a memory array to couple to the memory controller, the memory array comprising a multi-level cell non-volatile memory device configured as a plurality of data blocks comprising at least one full page block to include one or more full pages comprising a plurality of contiguous sectors, and at least one partial page block to include partial pages comprising a plurality of sectors configured to be assigned to the at least one full page block;
a partial page table maintained within the memory array to store one or more addresses of at least one page of the at least one partial page block, the partial page table to store a variable representing a partial page count remaining in the partial page block; and
a sector count table maintained within the memory array to store a number indicating the plurality of sectors for a selected page of the partial pages which are filled, the sector count table to store a location of a valid partial page that is next within the partial page block, wherein the memory controller is configured to fill one or more of the plurality of contiguous sectors of the one or more partial pages by storing data bits associated with at least one allocation request.

30. The apparatus of claim 29, wherein the memory controller is configured to find a last useable sector before an erased sector during the fill.

31. The apparatus of claim 29, wherein the memory controller is configured to receive an allocation request associated with a read operation, the allocation request to prompt assigning one or more partial pages of a plurality of sectors of data to the at least one full page block.

32. The apparatus of claim 29, wherein the memory controller is configured to receive an allocation request associated with a write operation, the allocation request to prompt the assigning one or more partial pages of a plurality of sectors of data to the at least one full page block.

33. A system, comprising:
a processor comprising a memory array;
a display to couple to the processor;
a wireless transceiver to couple to the processor;
a plurality of memory cells to be selected in response to receiving a memory allocation request from the processor, wherein the memory cells are organized to comprise at least one page block comprising at least one page comprising a plurality of contiguous sectors;
a partial page table maintained within the memory array and organized to store address information corresponding to at least one page of the at least one partial page block, the partial page table to store a variable representing a partial page count remaining in the partial page block; and
a sector count table maintained within the memory array and organized to store the quantity of filled sectors of the plurality of sectors, the sector count table to store a location of a valid partial page that is next within the partial page block.

34. The system of claim 33, wherein the plurality of memory cells comprise at least one of a single level cell structure and a multi-level cell structure.

35. The system of claim 33, wherein the plurality of memory cells comprise a NAND flash memory array.

36. The system of claim 33, comprising:
a lens; and
an imaging plane to couple to the processor, the imaging plane arranged to receive light captured by the lens.

37. The system of claim 33, wherein the wireless transceiver comprises a cellular telephone receiver.

38. The system of claim 33, comprising:
a media player and a keypad control module to couple to the processor.

39. The system of claim 33, comprising:
a modem to couple to the processor.

* * * * *